United States Patent [19]
Hosoda et al.

[11] Patent Number: 5,946,557
[45] Date of Patent: Aug. 31, 1999

[54] METHOD OF MANUFACTURING A SEMICONDUCTOR DEVICE HAVING DUMMY PATTERNS AND AN UPPER INSULATING LAYER HAVING CAVITIES

[75] Inventors: Yukio Hosoda; Masaaki Ichikawa, both of Kawasaki, Japan

[73] Assignee: Fujitsu Ltd., Kanagawa, Japan

[21] Appl. No.: 08/834,041

[22] Filed: Apr. 11, 1997

Related U.S. Application Data

[62] Division of application No. 08/544,589, Oct. 18, 1995, Pat. No. 5,652,465.

[30] Foreign Application Priority Data

Dec. 26, 1994 [JP] Japan ................................ 6-322236

[51] Int. Cl.$^6$ ................................................. H01L 21/82
[52] U.S. Cl. ........................... 438/128; 438/129; 438/183
[58] Field of Search .................................. 438/128, 129, 438/103, 587, 926

[56] References Cited

U.S. PATENT DOCUMENTS 5,293,503  3/1994  Nishigoori ........................ 174/250
5,430,325  7/1995  Sawada et al. .................... 257/618

FOREIGN PATENT DOCUMENTS

| 54-69393 | 6/1979 | Japan . |
| 57-205886 | 12/1982 | Japan . |
| 63-211739 | 9/1988 | Japan . |
| 63-236319 | 10/1988 | Japan . |

*Primary Examiner*—John F. Niebling
*Assistant Examiner*—Christopher Lattin
*Attorney, Agent, or Firm*—Armstrong, Westerman, Hattori, McLeland & Naughton

[57] ABSTRACT

A semiconductor device comprises a plurality of wiring formed on a lower insulating film to be spaced apart from each other, dummy patterns formed on the lower insulating layer between the plurality of wiring and spaced apart from each other, and an upper insulating layer formed to cover the plurality of wiring and the dummy patterns and having therein cavities formed in regions between the plurality of wiring and the dummy patterns.

4 Claims, 6 Drawing Sheets

METHOD OF MANUFACTURING A SEMICONDUCTOR DEVICE HAVING DUMMY PATTERNS AND AN UPPER INSULATING LAYER HAVING CAVITIES

This is a divisional of application Ser. No. 08/544,589 filed Oct. 18, 1995 now U.S. Pat. No. 5,652,465.

BACKGROUND OF THE INVENTION

1. Field of the Invention

The present invention relates to a semiconductor device and a method of manufacturing the same and, more particularly, a semiconductor device having a plurality of wiring formed to space apart from each other and a method of manufacturing the same.

2. Description of the Prior Art

In semiconductor integrated circuit devices, multi-layered wiring and high density wiring have been required according to high integration of the device.

Since an uneven surface of an interlayer insulating film is readily formed in the multilayered wiring structure, a wiring formed on the interlayer insulating film must be prevented from being cut off by reducing differences in the unevenness. In general, as a method of preventing the cut-off of the wiring, the upper surface of the interlayer insulating film has been planarized.

Usually planarization of the interlayer insulating film is effected by following steps.

As shown in a plan view of FIG. 1A, plural lower wiring 3 are first formed in parallel on a base insulating film 2 formed on a surface of a semiconductor substrate 1. Then, an $SiO_2$ film 4 serving as the interlayer insulating film is formed on an entire surface of the semiconductor substrate 1 by CVD process. In this case, as shown in a sectional view of FIG. 1B, the $SiO_2$ film 4 is grown on both surfaces of the base insulating film 2 and the wiring 3. For this reason, an uneven surface shape is generated on the $SiO_2$ film 4 according to the surface unevenness of the base insulating film 2 and the wiring 3.

Subsequently, silicon compound containing solution is coated on the $SiO_2$ film 4 by rotational coating. Then, solvent in the solution is removed by heating process. As a result, the surface of the $SiO_2$ film 4 is covered by a SOG (Spin On Glass) film 5 which is made of silicon compound and has an even surface. Subsequently, the SOG film 5 is etched back so as to be left partially on concave portions of the $SiO_2$ film 4. Both the $SiO_2$ film 4 and the SOG film 5 serve as the interlayer insulating film so that an even surface of the interlayer insulating film can be derived. Then, the $SiO_2$ film (not shown) is formed as a second layer by CVD process. A upper wiring (not shown) is formed on the second layer $SiO_2$ film.

In the meanwhile, since the insulating film 4 formed between the wiring 3, 3 serves as a dielectric film of a capacitor, wiring capacitance (parasitic capacitance) exists between two of the wiring 3.

The wiring capacitance C can be obtained according to following equation (1). The wiring capacitance C is proportional to a relative dielectric constant of the insulating film 4 located between two of the wirings 3, and is inversely proportional to an interval d between the wiring 3. In general, the relative dielectric constant of the $SiO_2$ is about 4 to 5. In the equation (1), $\epsilon_0$ denotes dielectric constant in vacuum, $\epsilon_r$ denotes relative dielectric constant, and S denotes an area of a side surface of the wiring 3.

$$C = \epsilon_0 \epsilon_r S/d \quad (1)$$

The interval d between the wiring 3, 3 becomes short and a multilayered structure of the wiring is advanced as high integration of the semiconductor integrated circuit device proceeds. As a result, the wiring capacitance is increased and thus an operation of the semiconductor device is further delayed.

SUMMARY OF THE INVENTION

An object of the present invention is to provide a semiconductor device capable of reducing wiring capacitance and a method of manufacturing the same.

According to the present invention, dummy patterns are formed in areas located between wiring, and the wiring and the dummy patterns are covered by an insulating film while cavities are formed in an insulating film between the wiring and the dummy patterns.

Thereby, the dielectric constant of dielectric material located between the wiring is decreased by existence of cavities in the insulating film. Therefore, reduction of operation speed of the device connected to these wiring can be suppressed.

Further, according to the present invention, areas in which the wiring and the dummy patterns are to be formed are surrounded by the guard pattern formed in the same layer as the wiring and the dummy patterns, and thus ends of cavities formed in the insulating film between the wiring and the dummy patterns are filled up by the insulating film formed around the guard pattern. As a result, when a planarization insulating material such as SOG is formed on the insulating film covering the wiring, the planarization insulating material can be prevented from entering into the cavities. Thus, the cavities can be formed firmly in the insulating film.

In addition, in case there is a possibility that a gas contained in the cavities is transmitted into the wiring via the insulating film to react the wiring, degradation of the wiring owing to the gas can be prevented by using inactive gas as the gas enclosed in the cavities.

BRIEF DESCRIPTION OF THE DRAWINGS

FIG. 3A is a sectional view taken along a line III—III in FIG. 2;

DESCRIPTION OF THE PREFERRED EMBODIMENTS

There will now be described preferred embodiments of the present invention hereinafter with reference to the accompanying drawings.

(First Embodiment)

Figure 2:
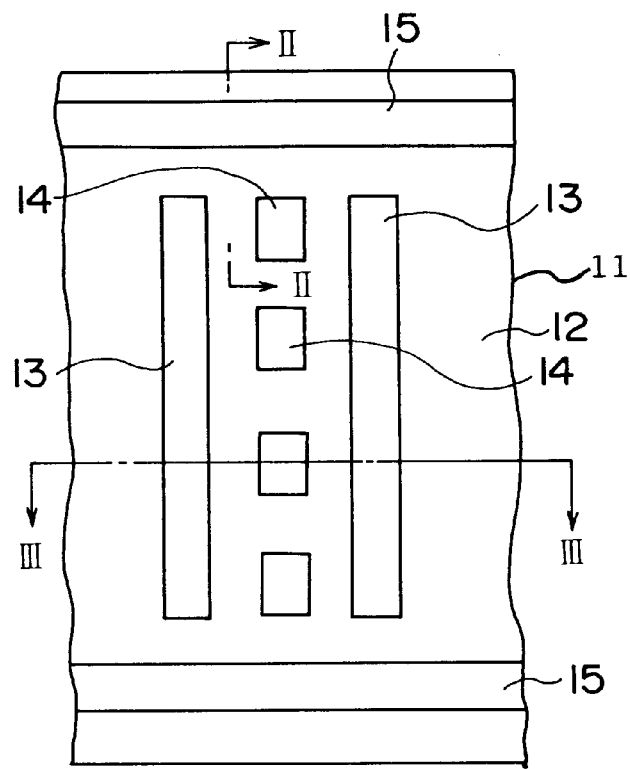
FIG. 2 is a plan view showing wiring patterns and other patterns of a semiconductor device according to a first embodiment of the present invention.
Figure 3A:
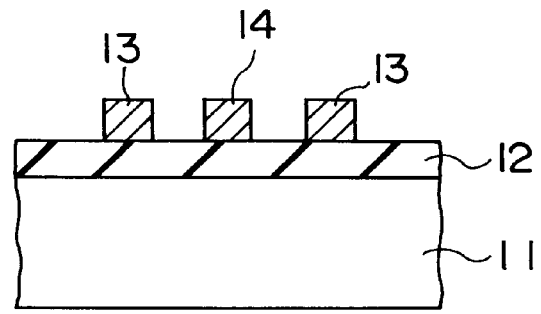
FIGS. 3A to 3C are sectional views showing forming steps of an interlayer insulating film of the semiconductor device of the first embodiment of the present invention, in particular.
Figure 3B:
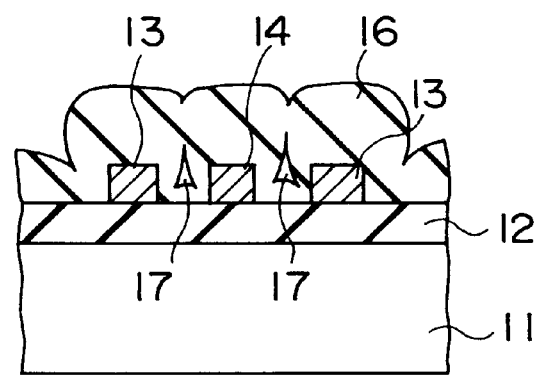
Figure 3C:
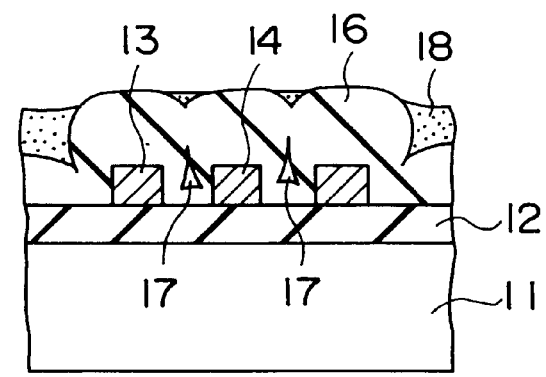

FIG. 2 is a plan view showing wiring patterns and other patterns of a semiconductor device according to a first embodiment of the present invention. FIGS. 3A to 3C are sectional views showing forming steps of an interlayer insulating film of the semiconductor device in FIG. 2.

Figure 1A:
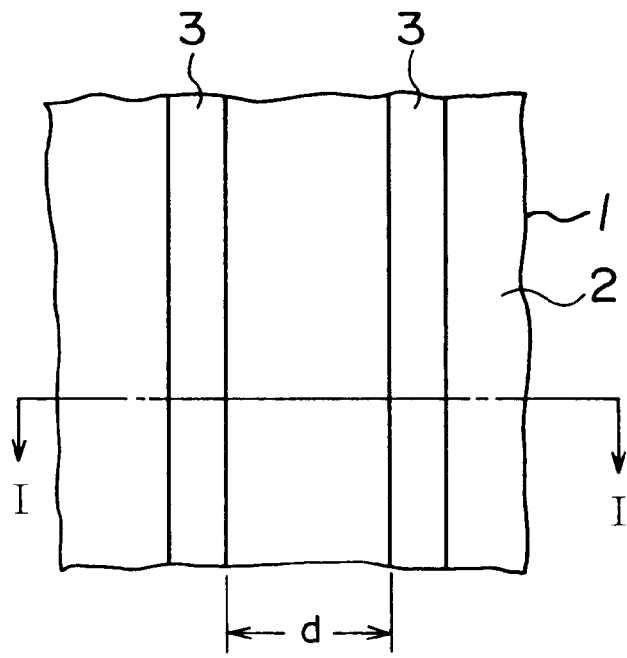
FIG. 1A is a plan view showing wiring patterns and an interlayer insulating film of a conventional semiconductor device.
Figure 1B:
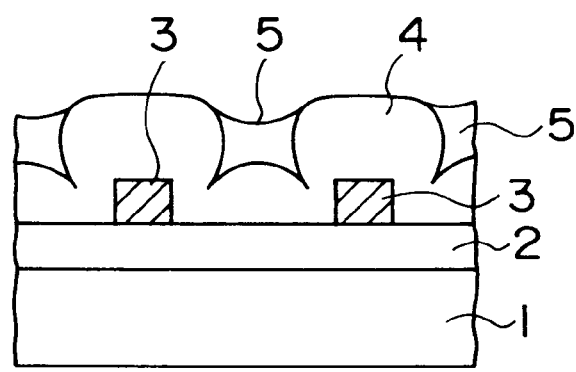
FIG. 1B is a sectional view taken along a line I—I in FIG. 1A.

In FIG. 2 and FIG. 3A, first a conductive film such as a metal film or an impurity containing semiconductor film is formed on a first insulating film 12 to have a thickness of about 0.8 µm. In the same manner as the prior art shown in FIGS. 1, the first insulating film 12 is formed on a semiconductor substrate 11. Then the conductive film is patterned by photolithography process to thus form wiring 13, dummy patterns 14 and a guard pattern 15.

The wiring 13 formed of the conductive film may be formed as wiring for connecting devices. Otherwise, part of the wiring 13 may be formed as gate electrodes of MOS transistors. For example, a plurality of wiring 13 are formed at a interval of 1.5 µm. A width of the wiring 13 is not limited particularly.

The dummy patterns 14 are formed between the adjacent wiring 13 and 0.5 to 0.6 µm apart from the neighboring wiring 13. As shown in FIG. 2, the dummy patterns 14 are formed as plural patterns divided in the direction along the wiring 13. A interval between the dummy patterns 14 is set to be 0.5 to 0.6 µm.

In addition, a guard pattern 15 made of the above conductive film is formed on a periphery of a region wherein the wiring 13 are to be formed. The guard pattern 15 is arranged apart from the wiring 13 and the dummy patterns 14 to prevent contact with them. It is preferable that the interval is set to be 0.6 µm or less.

After the wiring 13, the dummy patterns 14 and the guard pattern 15 are formed as above, as shown in FIG. 3B, a second insulating film 16 formed of SiO$_2$ is grown by plasma CVD process on both upper and side surfaces of respective wiring 13, dummy patterns 14 and guard pattern 15 in addition to the surface of the first insulating film 12. The growth of the second insulating film 16 is arrested after the second insulating film 16 formed on the wiring 13 and the second insulating film 16 formed on the dummy patterns 14 are come into contact with each other.

The second insulating film 16 must be grown under the condition that cavities 17 are formed in the second insulating film 16 between the wiring 13 and the dummy patterns 14. Such cavities 17 are also formed in the second insulating film 16 between the dummy patterns 14 and the dummy patterns 14. More particularly, the second insulating film 16 must be grown under the conditions that SiH$_4$ and N$_2$O are used, for example, as reaction gas used for growing the SiO$_2$ film, atmospheric pressure for growth is set to be 10 Torr or less, and a growth temperature is set within a range of 350 to 450° C. until the SiO$_2$ film has a film thickness of 1 µm on the upper surface of the wiring 13.

In case the guard pattern 15 does not exist on the semiconductor device, parts of the cavities 17 formed in the second insulating film 16 are readily exposed near edges of the wiring 13. This is because a thickness of the second insulating film 16 becomes thin more and more if the second insulating film 16 becomes far from the wiring 13.

Figure 4:
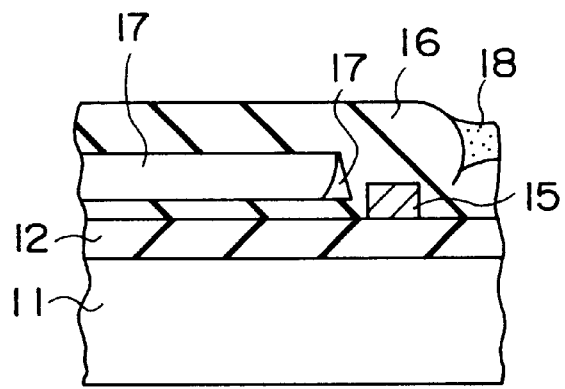
FIG. 4 is a sectional view taken along a line II—II in FIG. 2, wherein the interlayer insulating film is formed on the wiring patterns.

In case the guard pattern 15 exists on the semiconductor device, as shown in FIG. 4, ends of the cavities 17 are stopped up by the second insulating film 16 which is formed to bury regions between the dummy patterns 14 and the guard pattern 15 and regions between the wiring 13 and the guard pattern 15.

If the wiring 13 or the dummy pattern 14 and the guard pattern 15 are spaced apart at a interval of 0.5 to 0.6 µm, the cavities 17 are also formed in the second insulating film 16 located between the wiring 13 or the dummy pattern 14 and the guard pattern 15. However, since the guard pattern 15 is formed to have a ring plane shape, the cavities 17 formed in the second insulating film 16 are stopped up along the guard pattern 15. Consequently, the cavities 17 never appear at the surface of the second insulating film 16.

Next, as shown in FIG. 3C, silicon compound solution is coated on an entire surface of the second insulating film 16 by spin coating process so as to have a thickness of about 0.4 µm. Subsequently, the silicon compound solution is solidified or hardened by heating at a temperature of about 400° C. to form an SOG layer 18. The SOG layer 18 serves as a planarization insulating film.

In addition, after this SOG layer 18 is formed, the second insulating film 16 may be thinned by etching-back the SOG layer 18 and the second insulating film 16 using chlorine type etchant, according to a requirement of an improvement of flatness.

Thus, concave portions which are caused on the upper surface of the second insulating film 16 around the convex wiring 13 can be buried by the SOG layer 18. As a result, an interlayer insulating film consists of the second insulating film 16 and the SOG layer 18, so that the upper surface of the interlayer insulating film can be planarized.

Then, an upper wiring (not shown) is formed on the second insulating film 16 and the SOG layer 18, and then an insulating film (not shown) is formed on a resultant structure in the same manner as described above.

As has been described above, the cavities 17 having small relative dielectric constant are formed in respective insides of the second insulating film 16 which are formed between plural wiring 13. Therefore, the wiring capacitance C given by the equation (1) can be decreased, so that delay in device operation can be suppressed. The wiring capacitance is increased in fact since the dummy patterns 14 is formed between the wiring 13 to planarize the surface of the second insulating film 16. However, an increase in the parasitic capacitance due to the dummy patterns 14 can be suppressed since the dummy patterns 14 are divided into small patterns along the extending direction of the wiring 13 and further the cavities 17 also exist in the second insulating film 16 formed between divided dummy patterns 14.

In addition, if cavities are formed between wiring which are arranged in the obliquely upper or lower direction in a multilayered wiring structure, the wiring capacitance caused in the multilayered wiring structure can be suppressed.

(Second Embodiment)

Figure 5A:
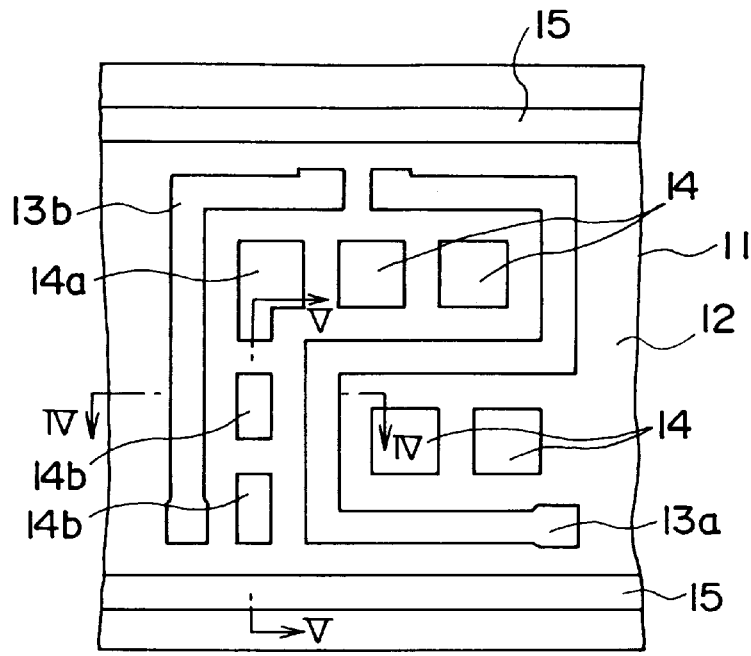
FIG. 5A is a plan view showing wiring patterns and other patterns of a semiconductor device according to a second embodiment of the present invention.

FIG. 5A shows wiring patterns and other patterns of a semiconductor device according to a second embodiment of the present invention.

In the above first embodiment, a plurality of dummy patterns 14 have been formed to have substantially identical plane shapes, and the dummy patterns 14 have been formed between two of the wiring 13 formed like a straight line. But the shape of the dummy pattern 14 is not restricted to such shape.

For instance, as shown in FIG. 5A, the plane shape of the dummy pattern may be varied correspondingly to the shape of the wiring. In other words, the dummy patterns 14*a* which are located near the corner portions of the wiring 13*a*, 13*b* may be formed as L-shaped portions. If the interval between the wiring 13*a*, 13*b* is short, the dummy patterns 14*b* may be formed as rectangular portions. Further, the dummy patterns 14 may be formed in an area which is surrounded by the U-shaped wiring 13*a*.

Figure 5B:
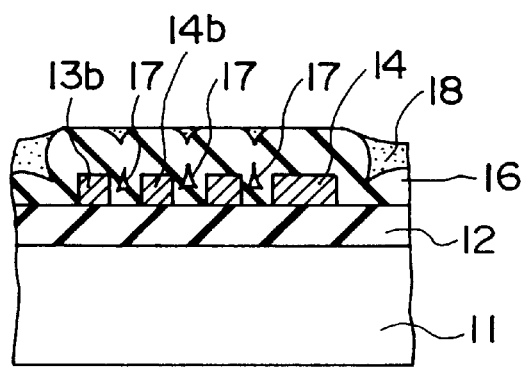
FIG. 5B is a sectional view taken along a line IV—IV in FIG. 5A.

In the case shown in FIG. 5A, if intervals between the dummy patterns 14, 14*a*, 14*b* and the wiring, 13*a*, 13*b* can be kept suitably, the cavities 17 shown in FIG. 5B may also be formed in the second insulating film 16 between them.

It is preferable that, in order to remain the cavities 17 in the second insulating film 16, the intervals between the dummy patterns 14, 14*a*, 14*b* and the wiring 13*a*, 13*b* are set within a range of 0.5 to 0.6 $\mu$m. By setting intervals between the dummy patterns 14, 14*a*, 14*b* within the same range as above, the cavities 17 can be formed in the second insulating film 16 between the dummy patterns 14, 14*a*, 14*b*.

Figure 5C:
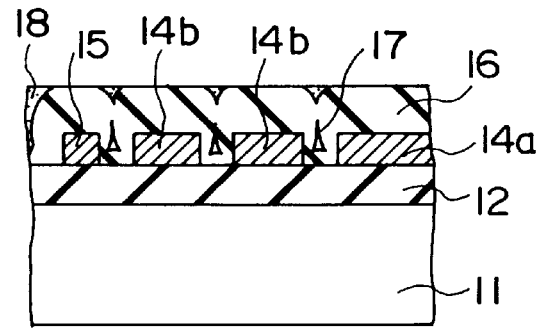
FIG. 5C is a sectional view taken along a line V—V in FIG. 5A.

As shown in FIG. 5C, since the second insulating film 16 is formed between the guard pattern 15 and the wiring 14*a*, 14*b*, the cavities 17 which are formed near the edge portions of the wiring 13*a*, 13*b* can be prevented from being exposed.

In FIGS. 5A, 5B and 5C, the same symbols as used in FIGS. 2A and 2B denote the same elements as in FIGS. 2A and 2B. In FIG. 5A, the interlayer insulating film is omitted.

In the meanwhile, the technology for forming the dummy patterns has been well known. Incidentally, if the intervals between the dummy patterns and the wiring are too long, the wiring capacitance can be reduced whereas the interlayer insulating film formed therebetween cannot be planarized.

(Third Embodiment)

Figure 6A:
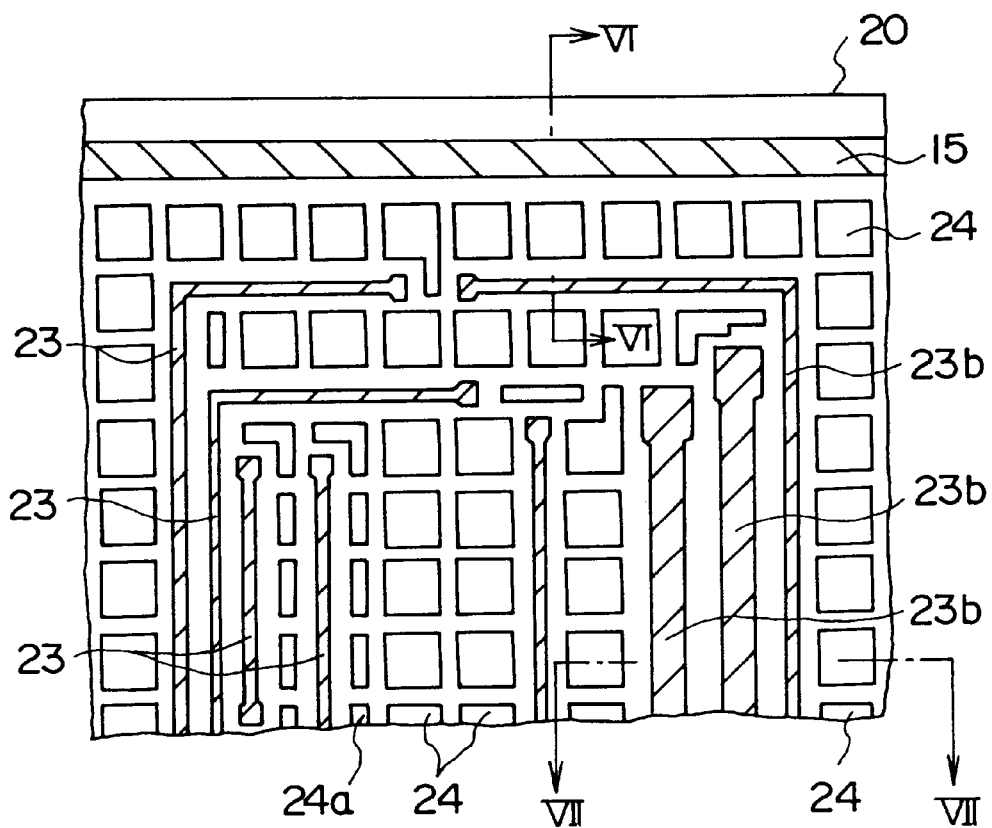
FIG. 6A is a plan view showing wiring patterns and other patterns of a semiconductor device according to a third embodiment of the present invention.

FIG. 6A shows wiring patterns and other patterns of a semiconductor device according to a third embodiment of the present invention.

In the first and second embodiments, the semiconductor devices wherein no dummy pattern is formed between the guard pattern and the wiring have been explained.

Figure 6B:
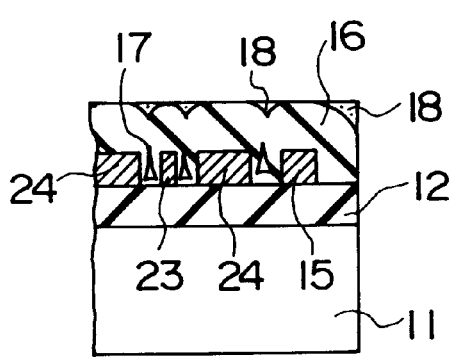
FIG. 6B a sectional view taken along a line VI—VI in FIG. 6A.

In case the intervals between the wiring and an outermost periphery of the semiconductor chip are too long, the dummy patterns must be formed between the wiring and the outermost periphery. For instance, as shown in FIG. 6A, dummy patterns 24 are interposed between the wiring 23 and the outermost periphery of the semiconductor chip 20. As a result, as shown in FIG. 6B, planarization of the second insulating film 16 which is formed near the outermost edge of the semiconductor chip 20 can be improved.

In this case, the cavities 17 are formed in the second insulating film 16 located between the dummy patterns 24 while the guard pattern 15 is formed between the dummy patterns 24 and the outermost edge of the semiconductor chip 20 to fill up the ends of the cavities 17.

In addition, as shown in FIG. 6A, if the intervals between the wiring 23 are too long, a plurality of dummy patterns 24, 24*a* may be formed between these wiring 23 so as to have spaces between the dummy patterns 24, 24*a*. In this case, the intervals between the dummy patterns 24, 24*a* and the wiring 23 as well as the intervals between the dummy patterns 24, 24*a* per se must be set to certain intervals which enable the cavities to be formed in the second insulating film 16.

Figure 6C:
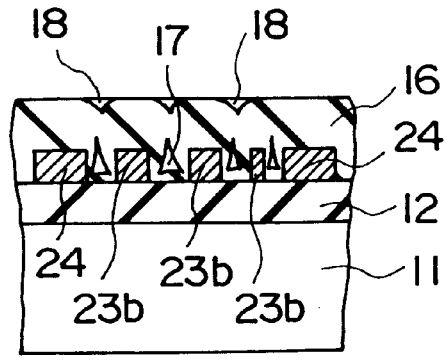
FIG. 6C is a sectional view taken along a line VII—VII in FIG. 6A.

Furthermore, as shown in FIG. 6C, if the wiring are formed so closely to each other that the dummy patterns can be omitted, it is desired that the wiring must be arranged separately to have spaces where the cavities 17 can be formed in the interlayer insulating film 16 between the wiring 23*b*. Thus, the wiring capacitance can be reduced. For example, the interval is set to 0.5 to 0.6 $\mu$m.

(Fourth Embodiment)

Figure 7:
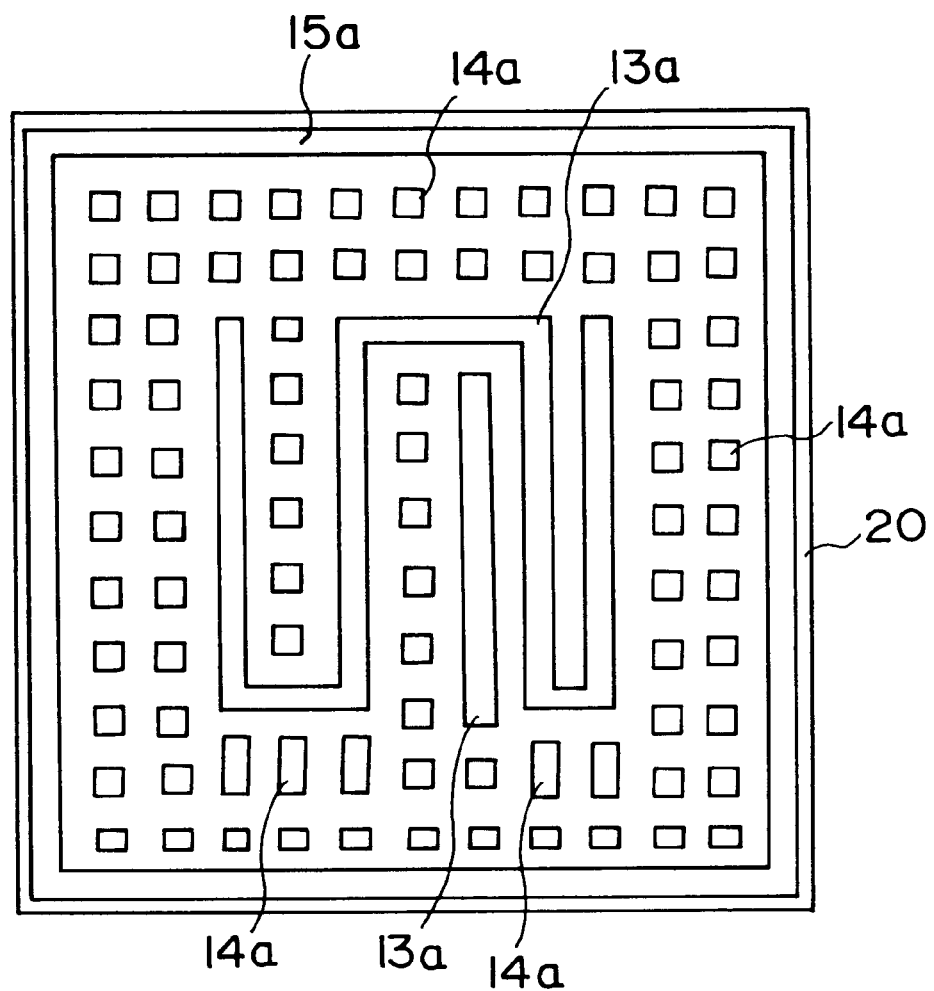
FIG. 7 is a plan view showing a semiconductor device according to a fourth embodiment of the present invention wherein wiring patterns and dummy patterns are surrounded by a guard pattern.

FIG. 7 shows a semiconductor device according to a fourth embodiment of the present invention.

In the above embodiments of the present invention, a case wherein the circuit area is surrounded by the guard pattern 15 has been explained. An entire schematic plan view is given as shown in FIG. 7. The guard pattern 15*a* is provided on the outermost periphery of the chip 20 of the semiconductor integrated circuit, then the wiring 13*a* are formed in the area surrounded by the guard pattern 15*a*, and then a plurality of dummy patterns 14*a* are formed to spread over areas between the wiring 13*a* and between the wiring 13*a* and the guard pattern 15*a*.

Consequently, the cavities shown in FIGS. 3B and 4 are formed in the second insulating film which is formed between the wiring 13*a*, between the wiring 13*a* and the dummy patterns 14*a*, and between the dummy patterns 14*a*. The end portions of the cavities are stopped up by the second insulating film formed in the inner area of the guard pattern 15*a*. As a result, the cavities are not exposed from the second insulating film at all, and the SOG film etc. never enter into the cavities.

As shown in FIG. 7, even though the wiring 13*a* is formed to have a U-shaped plane shape, the cavities can be formed in the insulating film formed in the area surrounded by the wiring 13*a* if the dummy patterns 14*a* are formed in that area. For this reason, the wiring capacitance generated between the wiring 13*a* and upper wiring can be reduced.

In addition, the shape of the guard pattern 15*a* is not always limited to the endless ring shape. A slit or slits may be formed in part of the ring shape.

(Other Embodiment)

The second insulating film 16 covering the wiring 13, the dummy patterns 14 and the guard pattern 15 may be formed by sputtering in an inactive gas atmosphere such as argon or nitrogen. Thereby, inactive gas can be filled in the cavities 17 in the second insulating film 16 formed as above. Since the second insulating film becomes thin on the side surfaces of the wiring 13, there is a possibility that the wiring 13 are degraded by the gas entering into the wiring 13 from the cavities 17. Even in such case, the degradation of the wiring 13 can be prevented if the inactive gas is contained in the cavities 17.

As the second insulating film 16 covering the wiring 13, the dummy patterns 14 and the guard pattern 15, silicon-nitride-oxide, silicon nitride, fluorine containing silicon oxide film, and PSG as well as silicon dioxide ($SiO_2$) may be used.

When the interval between the wiring pattern 13 and the dummy pattern 14, or between wiring pattern 13 and the guard pattern 15, or between the dummy pattern 14 and guard pattern 15 is set to be more than 0.6 $\mu$m or less than 0.5 μm, the cavity 17 is made in the insulating film 16 between these patterns by changing the condition of growing the insulating film 16, for example, in thickness or growth rate.

What is claimed is:

1. A method of manufacturing a semiconductor device, comprising the steps of:

forming a conductive film on a base insulating film;

forming a plurality of wiring on said base insulating film and also forming dummy patterns in regions surrounded by said plurality of wiring, by patterning said conductive film; and forming a second insulating film so as to cover said plurality of wiring and said dummy patterns and such that said second insulating layer has a cavity embedded therein and shielded thereby between said plurality of wiring and said dummy patterns.

2. A method of manufacturing a semiconductor device according to claim 1, further comprising the steps of, upon patterning said conductive film:

forming a guard pattern so as to surround regions wherein said plurality of wiring and said dummy patterns are formed; and forming an upper insulating film on a surface of said guard pattern.

3. A method of manufacturing a semiconductor device according to claim 2, further comprising the steps of, after forming said upper insulating film:

forming a planarization insulating film on said upper insulating film.

4. A method of manufacturing a semiconductor device according to claim 1, wherein said insulating film is formed in an atmosphere including inactive gas.

* * * * *